United States Patent
Kim et al.

[11] Patent Number: 6,123,133
[45] Date of Patent: Sep. 26, 2000

[54] TAPE HAVING ELECTRONIC ELEMENTS THEREON AND SYSTEM FOR USING THE SAME

[75] Inventors: Woo-Sig Kim; Masaharu Sukue; Choul-Su Kim; Kyung-Soo Han, all of Kyonggi-do, Rep. of Korea

[73] Assignee: SamSung Electronics Co., Ltd., Kyungki-do, Rep. of Korea

[21] Appl. No.: 08/902,355

[22] Filed: Jul. 29, 1997

[30] Foreign Application Priority Data

Jul. 29, 1996 [KR] Rep. of Korea .................. 96-31301

[51] Int. Cl.[7] ............................................ B32B 31/00
[52] U.S. Cl. ........................................ 156/378; 156/538
[58] Field of Search ............................... 156/252, 253,
156/378, 433, 510, 516, 523, 538, 539;
29/516, 564.3, 566.2, 564.1, 566.3, 564.8,
753, 836, 837

[56] References Cited

U.S. PATENT DOCUMENTS

| | | | |
|---|---|---|---|
| 4,077,439 | 3/1978 | Hamuro et al. ........................... | 140/1 |
| 4,344,219 | 8/1982 | Tanabe et al. . | |
| 4,568,416 | 2/1986 | Okui et al. . | |
| 4,631,800 | 12/1986 | Ishii et al. ............................... | 29/564.6 |
| 4,877,174 | 10/1989 | Bruhn ........................................ | 228/5.1 |
| 4,966,281 | 10/1990 | Kawanishi et al. . | |
| 5,562,384 | 10/1996 | Alvite et al. ............................. | 414/222 |

*Primary Examiner*—Merrick Dixon
*Attorney, Agent, or Firm*—Robert E. Bushnell, Esq.

[57] ABSTRACT

A tape for use in estimating how many electronic parts being fed to an electronic part inserting machine remain on the tqape and a system for using the same. More particularly, a system which counts the remaining electronic parts on the end portion of the tape and sets up a most suitable time that the presently used tape should be replaced with a new one so that the system dead time which may occur during the replacement of tape rolls is remarkably reduced. This tape includes a mark formed at the beginning of an end portion of the tape where some electronic parts are left to be fed to the electronic part inserting machine, and the mark is sensed by a sensor so that the count starts when the end portion of the tape is sensed. The electronic parts inserting machine employing this tape is comprised of a memory for storing a value corresponding to the number of remaining parts attached to the end portion of the tape, a counter for counting down from the number stored in the memory as each remaining part is used, a displayer for displaying the count value generated by the counter, and an CPU for controlling the memory and the counter.

7 Claims, 4 Drawing Sheets

TAPE HAVING ELECTRONIC ELEMENTS THEREON AND SYSTEM FOR USING THE SAME

CLAIM OF PRIORITY

This application makes reference to, incorporates the same herein, and claims all benefits accruing under 35 U.S.C. §119 from an application entitled Tape Having Electronic Elements Thereon and System for Using the Same earlier filed in the Korean Industrial Property Office on Jul. 29, 1996, and there duly assigned Ser. No. 96-31301 by that Office.

1. Background of the Invention

The present invention relates generally to a tape capable of estimating how many electronic parts being fed to an electronic part inserting machine remain and a system for using the same. More particularly, this system counts the remaining electronic parts on the end portion of the tape and sets up a most suitable time that the presently used tape should be replaced with new one, by which means, system dead time for the replacement of tape rolls is remarkably reduced.

2. Description of the Prior Art

Generally, electronic part automatic inserting process is carried out through a series of steps in which electronic parts such as resistors, capacitors, etc., all being attached to a roller-shaped feeder, are supplied on a tape, separated from the tape by an adsorptive unit, and inserted into predesignated points of a printed circuit board (PCB) with accuracy. U.S. Pat. No. 4,631,800 to Taira Ishii et al. entitled Electronic Parts Outfitting Device and U.S. Pat. No. 4,344,219 to Tetsuo Tanabe et al. entitled Apparatus For Arranging Parts exemplify known apparatus and processes for inserting electronic parts fed by a tape on a PCB.

It is known that some electronic part inserting devices utilize a plurality of the tape supply units juxtaposed with each other, such that the tape supply units are designed to reel out the tape by one pitch of element arrangement so that the elements attached on the tape at regular intervals therebetween are fed to the device in order. A position designating device sets up the points where the respective electronic parts should be employed prior to the PCB mounting step. The respective electronic parts are aligned on the tape in such a manner that their leads adhere to the tapes. With the tape being wound to form a roll, the tape is applied to the reel and the electronic parts are fed to the automatic electronic part inserting machine while the tape supply unit unbinds the wound tape. However, such an operated system has a disadvantages that when some parts are exhausted during the process, the process continues without supplying those parts, thereby producing a poor PCB which has some parts missing.

In view of this, one popular method that is used disposes the elements on the tape keeping an area near the end portion of the tape as an area where elements are not disposed so that the tape roll can be replaced with a new one when such an area near the end portion is sensed. However, in this method, the system must be stopped during the time corresponding to area having no elements and it is impossible to use the elements disposed on the end portion of the tape following the area having no elements.

SUMMARY OF THE INVENTION

This invention has as an object the provision of a tape on which electronic parts are arranged to minimize system dead time which may occur when exchanging a tape and also to enable all the electronic parts adhering to the tape roll to be used without exception.

Another object is the provision of a system for automatically inserting the electric elements arranged on the tape to an objective.

To obtain these objects, according to the present invention, a tape having electronic parts attached to on one side thereof includes a mark element formed at nearly one end portion of the tape where some electronic parts are left not to be fed to an electronic parts inserting machine, ensuring the end portion of the tape starts from just that place.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENTS

A typical inserting process is described with respect to FIGS. 1–4 wherein an exemplary electronic part inserting machine and a tape for providing electronic parts for insertion in a PCB are illustrated.

Figure 1:
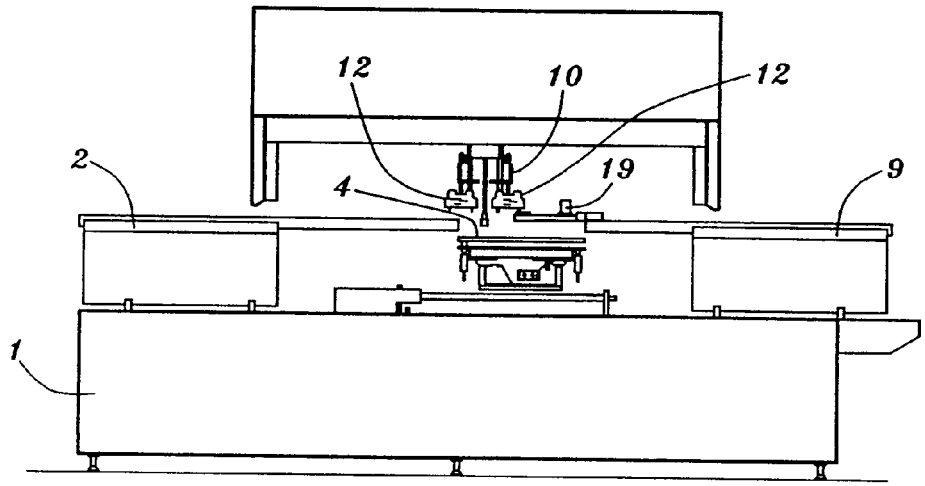
FIG. 1 is an front view of an exemplary automatic electronic parts inserting machine.
Figure 2:
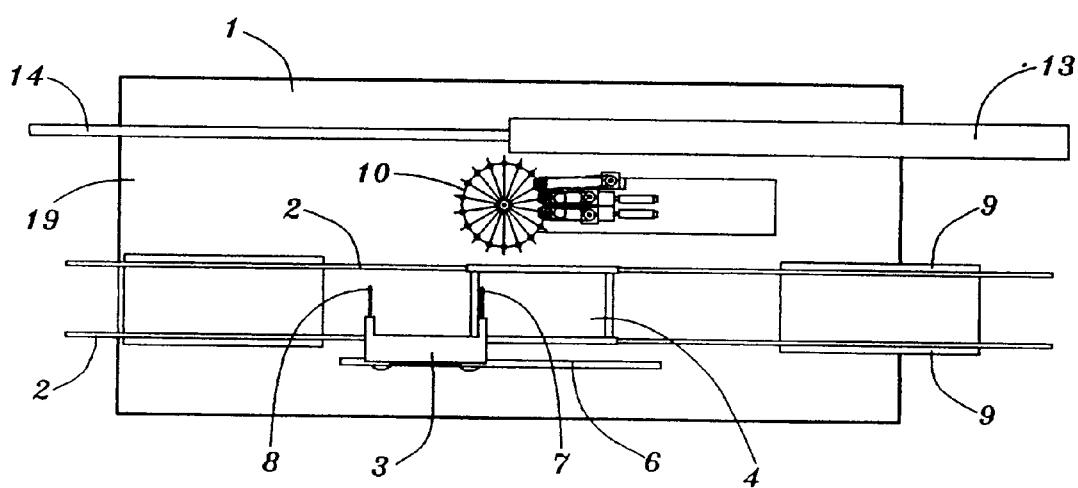
FIG. 2 is a top view of a the automatic electronic parts inserting machine of FIG. 1
Figure 3:
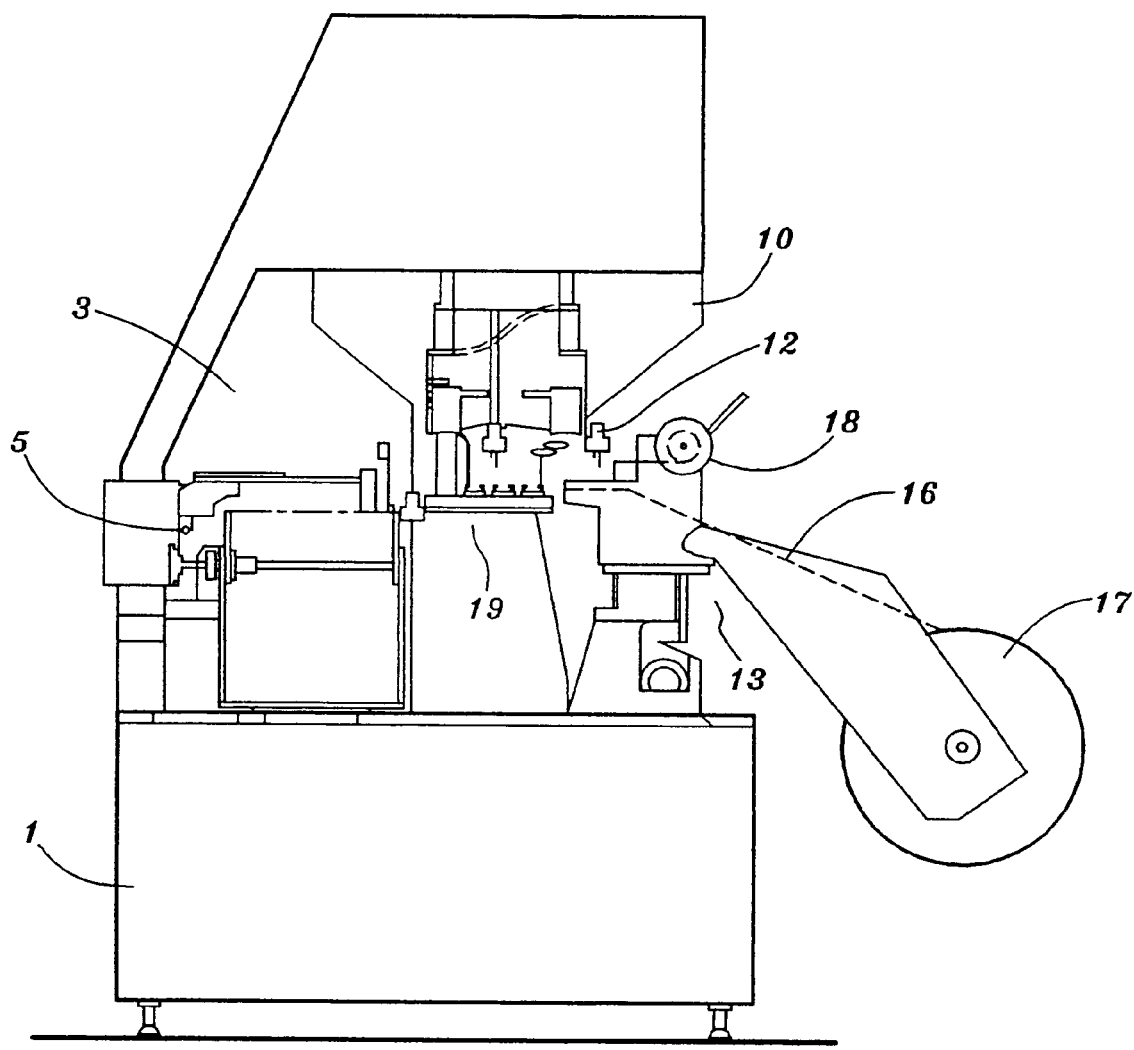
FIG. 3 is a side view of the automatic electronic parts inserting machine of FIGS. 1 and 2.
Figure 4:
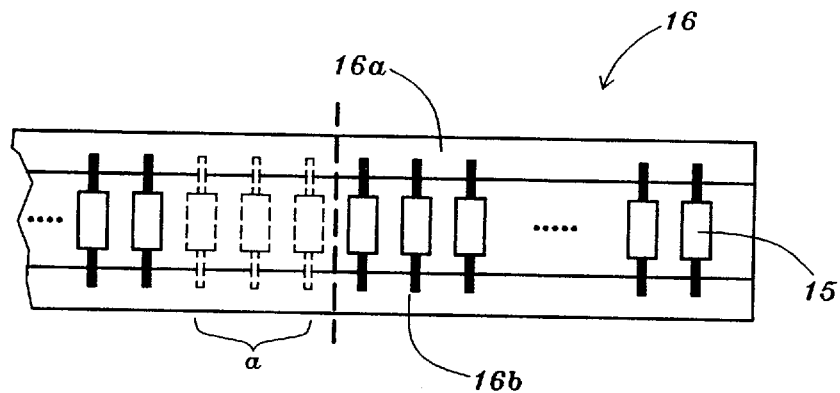
FIG. 4 is a grossly enlarged development view of the tape wound on a reel of the automatic electronic parts inserting machine of FIG. 1.

In these figures, the electronic part inserting machine has a base, a first conveyor 2 for carrying the PCB, an exchanger 3 for changing the mounting position of the PCB from first conveyor 2 to a XY table 4. Exchanger 3 is disposed on a supporting shaft 5 to secure rotation in connection with the shaft 5, while permitting displacement along a rail 6. A couple conveyance hooks 7, 8 move the PCB from the first conveyor 2 to XY table 4 and then to a second conveyor 9. When the PCB is loaded on XY table 4, XY table 4 is lowered by a drive motor (not shown), thereby ensuring movement XY table 4 in the X, Y and Z directions. A turn table 10 is rotated irregularly since it is attached to an index unit 11 rotated by the drive motor. Around the edge of turn table 10 is a plurality of absorbing heads 12 spaced at regular intervals to permit up-and-down motion of turn table 10. Further, an element supply board 13 is provided movably along a rail 14, and a plurality of the tape supply units 18, juxtaposed with each other, are designed to reel out tape 16 at a set tape pitch so that the elements 15 attached to tape 16 at regular intervals are fed to the turn table 10 in order. A position designating device 19 sets up the points where the respective electronic parts should be employed prior to the PCB mounting step. As lowered, XY table 4 is permitted to move in both the X and Y directions with respect to the lowering (Z) direction of turn table 10 and position designating device 19. FIG. 4 is an enlarged view of a portion of tape 16 wound up a reel 17 of FIG. 3. As shown in FIG. 4, the respective electronic parts 15 are aligned on the tape in such a manner that their leads adhere to the tapes 16a and 16b. Electronic parts 15 are fed to the automatic electronic part inserting machine when the tape supply unit unbinds the wound tape. When the device reaches area α in which a gap between electronic parts is formed by not mounting several parts 15 to tape 16, area α is sensed causing the operation of the device to stop so that tape 16 can be replaced with a fresh role of tape having parts 15 mounted thereon. According, area 15 indicates that tape 16 is at its end.

Figure 5:
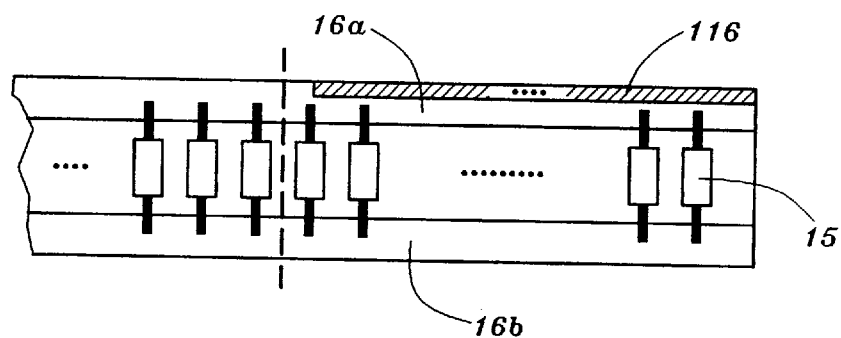
FIG. 5 is a tape on which electronic parts are aligned in accordance with an embodiment of the present invention.

FIG. 5 shows a tape on which electronic parts 15 are aligned at regular intervals in accordance with an embodiment of the present invention. As shown in FIG. 5, both leads of each element 15 are attached to tapes 16a and 16b, respectively, and near an end portion of the tape a mark 116 is provided. In this structure, an important thing is that mark 116 can be formed in various manners. For example, mark 116 can be formed by making tape 16a and/or tape 16b thicker or thinner at that point than the rest of the tape. Another example would be to form mark 116 with a light reflecting material having greater reflection properties that the rest of the tape. A further example would be to form mark 116 by using a coating of magnetic material. Note that mark 116 can be formed on one or both tapes 16a and/or 16b.

Figure 6:
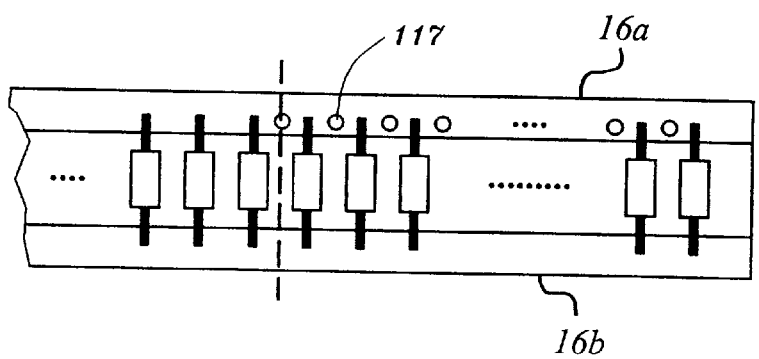
FIG. 6 is a tape on which electronic parts are aligned in accordance with another embodiment of the present invention.

FIG. 6 shows another embodiment of the present invention where main construction of the tape and electronic parts is similar to that of FIG. 5 except that mark 116 of FIG. 5 is replaced by a plurality of holes 117 along the tape.

Figure 7:
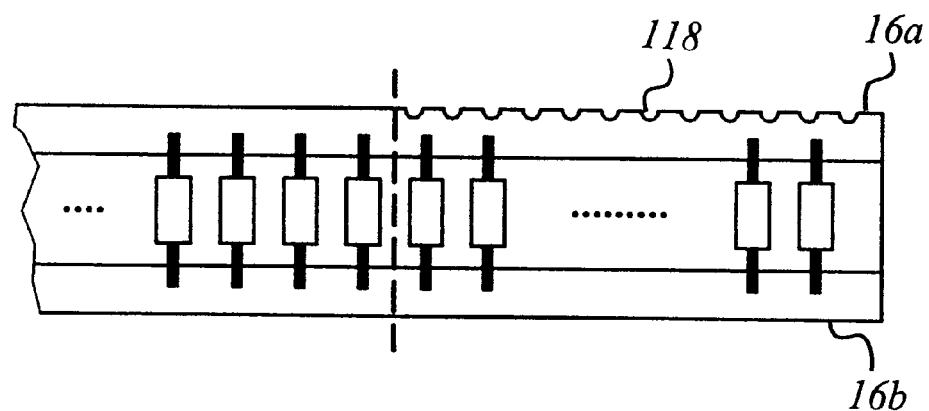
FIG. 7 is a tape on which electronic parts are aligned in accordance with still another embodiment of the present invention.

FIG. 7 shows still another embodiment of the present invention where main construction of the tape and electronic parts is similar to that of FIG. 5 except that mark 116 of FIG. 5 is replaced by a series of grooves 118 on one side of either tape, such that the tape has a serrated edge.

Similar to the embodiment discused with respect to FIG. 5, the marks provided at the end portion of the tape in FIGS. 6 and 7 can be provided on either tape or on both tapes, as desired.

Figure 8:
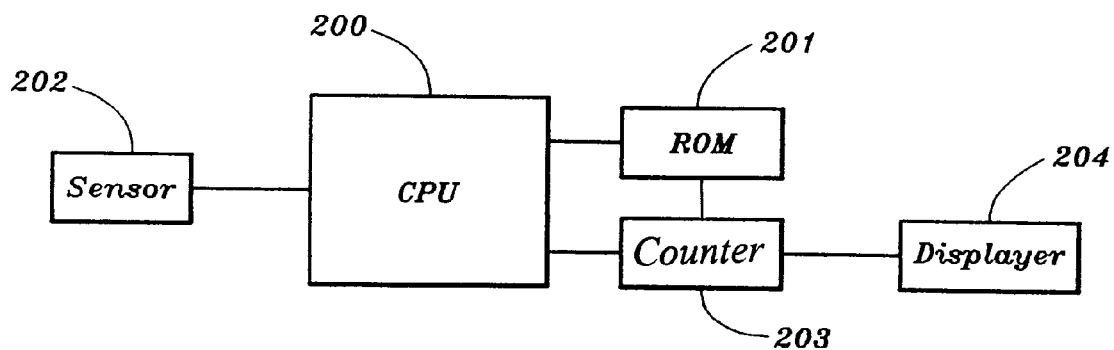
FIG. 8 is diagrammatical block diagram for illustrating the system of the present invention.

As shown in FIG. 8, in order to utilize the tapes discussed above with respect to FIGS. 5–7 an electronic parts inserting machine comprises of a read only memory (ROM) 201 for storing an system operating program and for storing value (e.g. 100) indicative of the number of parts 15 that should be remaining at the end of the tape once the marks (116, 117 or 118) are detected, a sensor 202 for sensing a mark on the tape, a counter 203 for down-counting the remaining electronic parts based upon the signal from central processing unit (CPU) 200, and a displayer 204 for displaying a number in reponse to the signal from counter 203, wherein CPU 200 controls the aforementioned elements as follows.

When sensor 202 detects the mark near the end of the tape, CPU 200 controls ROM 201 to read out the set value of remaining parts and sets the value in counter 203. As each remaining part on the tape is inserted in the PCB, CPU 200 controls counter 203 to count down from the set value. Displayer 204 displays the value output by counter 204, for example, 100, 99, 98 and so on.

Accordingly, by sensing the number of electronic element remaining on the tape, a suitable time is provided to allow the operator of the electronic part inserting machine to prepare to replace the tape, thus minimizing system dead time which may occur during replacement of the tape roll, while removing the factors responsible for the possible poor quality by omission of certain electronic parts in the prior art, and ensuring that all the electronic parts on the tape are used.

What is claimed is:

1. A tape for feeding electronic parts to an electronic parts inserting machine, comprising:

a tape for carrying the electronic parts, the tape having a predetermined width and on which the electronic parts are mounted to be spaced at a predetermined distance from each other; and an identifying mark which is formed on a terminal portion of the tape, for indicating that an end of the tape is near.

2. A tape for feeding electronic parts to an electronic parts inserting machine as claimed in claim 1, wherein the terminal portion of the tape on which the mark is formed has a different thickness from another portion of the tape.

3. A tape for feeding electronic parts to an electronic parts inserting machine as claimed in claim 1, wherein the mark includes a plurality of holes perforated to be spaced at a predetermined distance from each other in the terminal portion of the tape.

4. A tape for feeding electronic parts to an electronic parts inserting machine as claimed in claim 1, wherein the mark comprises a light reflecting surface having a reflecting degree different from that of tape.

5. A tape for feeding electronic parts to an electronic parts inserting machine as claimed in claim 1, wherein the mark includes a magnetic material attached to the terminal portion of the tape.

6. A tape for feeding electronic parts to an electronic parts inserting machine as claimed in claim 1, wherein the mark includes a plurality of grooves formed to be spaced at a predetermined distance from each other on the terminal portion of the tape.

7. A tape for feeding electronic parts to an electronic parts inserting machine as claimed in claim 1, wherein the mark includes a serrate projection extending outwardly from the terminal portion of the tape.

* * * * *